United States Patent [19]

Tretola

[11] 4,207,137
[45] Jun. 10, 1980

[54] METHOD OF CONTROLLING A PLASMA ETCHING PROCESS BY MONITORING THE IMPEDANCE CHANGES OF THE RF POWER

[75] Inventor: Angelo R. Tretola, Berkeley Heights, N.J.

[73] Assignee: Bell Telephone Laboratories, Incorporated, Murry Hill, N.J.

[21] Appl. No.: 29,674

[22] Filed: Apr. 13, 1979

[51] Int. Cl.² .......................................... H01L 21/306
[52] U.S. Cl. .................................... 156/627; 156/643; 156/646; 156/657; 204/192 E; 219/121 P; 250/531; 324/65 R; 328/132
[58] Field of Search ............... 156/626, 627, 643, 657, 156/646; 204/192 E; 250/531; 219/121 P; 324/158 R, 158 D, 58 R, 58.5 R, 61 R, 65 R; 328/114, 132

[56] References Cited

U.S. PATENT DOCUMENTS

| | | | |
|---|---|---|---|
| 3,265,967 | 8/1966 | Heald | 324/58.5 R |
| 3,596,190 | 7/1971 | Marshall | 328/132 |
| 3,757,733 | 9/1973 | Reinberg | 204/192 |
| 3,766,411 | 10/1973 | Arnold | 328/114 |
| 3,867,216 | 2/1975 | Jacob | 156/643 |
| 4,041,404 | 8/1977 | Lewis | 328/132 |
| 4,064,408 | 12/1977 | Hon et al. | 328/132 |
| 4,115,184 | 9/1978 | Poulsen | 156/626 |

OTHER PUBLICATIONS

Ukai et al., "End Point Determination . . . Monitoring" at American Vacuum Soc. 25th National Symposium, (11/78), San Francisco, Ca., pp. 1–6.
Somekh, "Introduction to . . . Etching," *Journal of Vacuum Science Tech.*, vol. 13, No. 5, (Sep. 1976), pp. 1003–1007.
Daley et al., "Determining the Etching . . . Etching," *IBM Technical Disclosure Bull.*, vol. 20, No. 11B, (4/78) p. 4802.

Primary Examiner—Jerome W. Massie
Attorney, Agent, or Firm—Lester H. Birnbaum

[57] ABSTRACT

A plasma etching process wherein the end point of the reaction can be accurately determined for fine line definition. This is accomplished by monitoring the impedance of the plasma during the reaction. The reaction is stopped at, or a predetermined time after, the change in impedance reaches a zero value, which is either a maximum or minimum depending upon the gases utilized.

14 Claims, 7 Drawing Figures

METHOD OF CONTROLLING A PLASMA ETCHING PROCESS BY MONITORING THE IMPEDANCE CHANGES OF THE RF POWER

BACKGROUND OF THE INVENTION

This invention relates to plasma etching processes, and in particular to a method for stopping the process at the point where a layer is completely etched through.

A great deal of development in integrated circuit fabrication is presently directed to producing smaller circuits which require very fine line definition. For example, in the silicon gate technology employed for MOS circuits used in microprocessors, it is now desired to achieve gate widths as small as $1.0\mu$. Similar fine line definition is also desirable for etching other layers, such as silicon dioxide and silicon nitride typically used for surface passivation, and aluminum used for ohmic contacts in integrated circuits.

As a result of this need for fine line definition, the attention of the industry has been increasingly directed to plasma etching processes. Basically, such processes involve placing the semiconductor in a chamber, introducing a gas therein and applying an electric field to the gas utilizing a voltage which alternates at an RF frequency so as to create a plasma. In the case of etching processes, the plasma includes highly reactive gas species which react with the layer to be etched to produce a volatile gas which can be pumped out of the chamber. The layer can be selectively etched by using a suitable mask such as a photoresist.

Such processes are in general capable of etching patterns with sufficient resolution for present and future generations of circuits. However, care must be taken to insure that the reaction continues just long enough to reproducibly achieve the precise line width desired. If there is too little etching, the pattern will not be completely removed in the selected areas, and if there is too much etching, undercutting will result (see, for example, Somekh "Introduction to Ion and Plasma Etching", *Journal of Vacuum Science Technology*, Vol. 13, No. 5 pp. 1003-1007 (September/October 1976)).

One standard approach is to determine the proper end point empirically based on the type of layer, thickness, number of wafers, power, gas flow and other factors. This approach, of course, requires a new determination for each system and etching condition. Further, variations in parameters can occur during the reaction which will affect the time of etching completion. A further approach is to detect emission spectra changes in gas reactants or products and stop the reaction when the appropriate spectral line indicated on a strip line recorder reaches a certain value. Although adequate, this approach also has the disadvantage of requiring a new detection scheme for each reaction. Further, the plasma chamber would often cloud up, interfering with the optical detection. Also, many reaction chambers are made of metal and cannot employ such detection means.

It is therefore a primary object of the invention to provide a plasma etching process including means for accurately detecting the completion of the etching reaction which is generally applicable regardless of the particular reaction and parameters.

SUMMARY OF THE INVENTION

This and other objects are achieved in accordance with the invention. The invention involves a method of etching a selected area of a layer formed over a body including the steps of placing the substrate in a chamber within electrode means, introducing a reactant gas into the chamber, and supplying power to the electrode means sufficient to create a plasma in the chamber which is capable of etching the layer. The impedance of the plasma is monitored during the etching reaction and the power to the electrode means is turned off at a predetermined time with respect to the point where the impedance change essentially reaches zero. This point can either be a maximum or minimum depending on the type of reactant gas. The reaction can be stopped at the maximum or minimum or, if desired, the reaction can be continued for a predetermined time after this point primarily for cosmetic purposes.

BRIEF DESCRIPTION OF THE DRAWING

These and other features will be delineated in detail in the following description. In the drawing.

It will be appreciated that for purposes of illustration, these figures are not necessarily drawn to scale.

DETAILED DESCRIPTION

Figure 1:
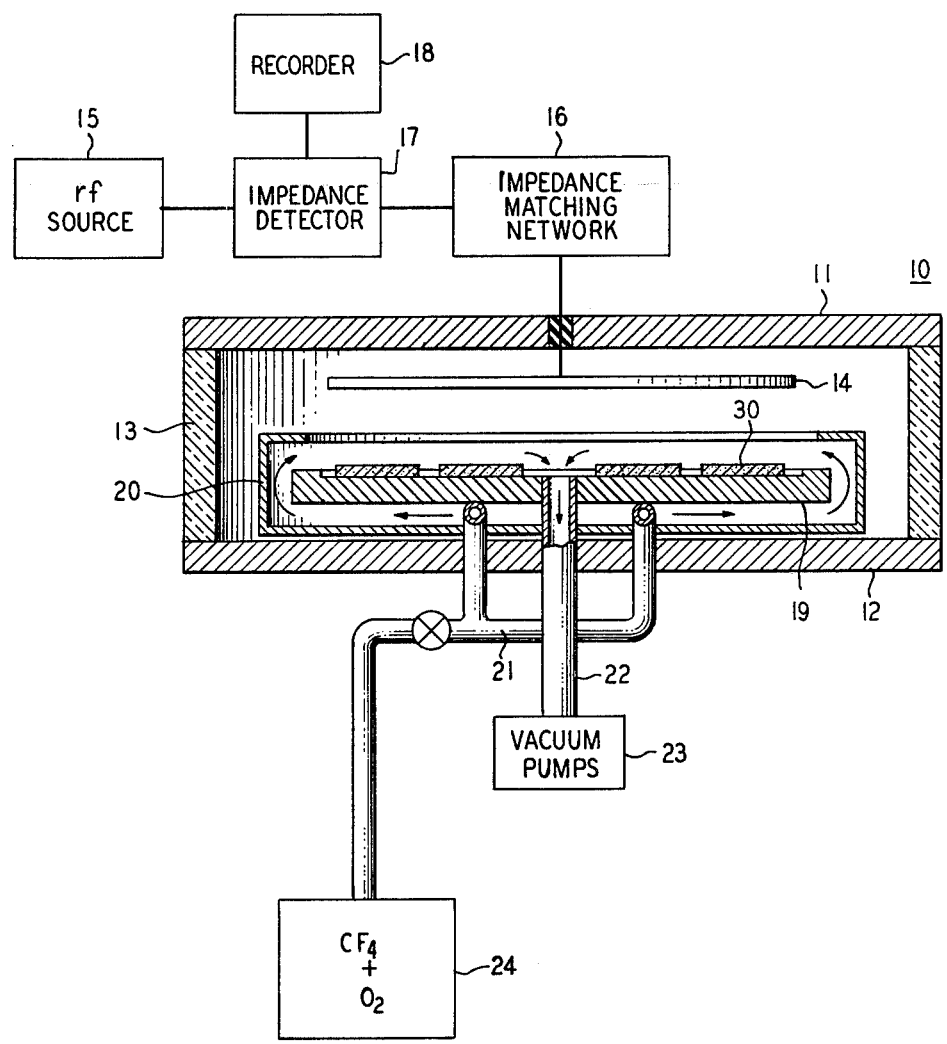
FIG. 1 is a schematic illustration of a plasma etching apparatus which may be utilized in accordance with one embodiment of the invention.

The invention will be described with reference to a typical plasma etching apparatus illustrated schematically in FIG. 1. It should be realized that such apparatus is illustrative only and the invention may be used with any type of plasma etching apparatus suitably modified in accordance with the principles of the invention.

The apparatus is a radial flow reactor which is similar to that, for example, shown in U.S. patent application of Hauser and Sinha, Ser. No. 651,556, filed Jan. 22, 1976 and assigned to the present assignee. The reaction chamber, 10, includes top and bottom plates 11 and 12, respectively coupled by cylindrical side wall 13 in such a manner that the chamber can be evacuated. A first circular electrode, 14, located within the chamber is coupled to an rf source 15 through an impedance matching network, 16, and impedance detector, 17. A stripline recorder, 18, is coupled to the impedance detector. The significance of the detector and recorder will be discussed later. A second circular electrode, 19, supports the semiconductor wafers, 30, being processed. A gas flow shield, 20, surrounds the electrode, 19, except for the portion on which the wafers are placed. Pipe 21 is provided for introducing the reactant gas or gases into the chamber, while pipe 22 and vacuum pump 23 provide an exhaust. A source, 24, of a reactant gas, in this case a mixture of primarily $CF_4$ and $O_2$ is coupled to input pipe 21.

While the electrode means for supplying an electric field to the chamber is shown as a pair of circular electrodes within the chamber, it will be appreciated that other means known in the art may be employed. For example, the electrode means could be in the form of plates or a coil on the outside of the chamber (see U.S. Pat. No. 3,867,216 and U.S. Pat. No. 4,115,184).

In a typical etching operation, the reaction chamber was pumped down to a pressure of approximately 0.02 Torr. The reactant gas was a mixture of approximately 91.5% $CF_4$, 8% $O_2$ and 0.5% $N_2$. The gas was introduced into the reaction chamber through pipe 21 following the direction indicated by the arrows. The flow rate was 50–100 SCCM. The semiconductor structures 30, were kept at room temperature. Although the invention may be employed regardless of the temperature of the structure, it is preferable to keep the temperature essentially constant ($\pm 1$ degree C.) throughout the reaction. Power was supplied to the electrodes by rf source 15 to form a plasma in the chamber. The magnitude of power desirable is a function of the geometry of the electrodes and the spacing therebetween. In this case, for circular electrodes having diameters of 18 inches and separated by approximately 2 inches, the applied power was approximately 100 watts.

The plasma generated by the applied electric field included highly reactive fluorine ions. These ions, reacted with the layer formed over the semiconductor body, in this case polycrystalline silicon having a thickness of approximately 0.6 $\mu$m, to form $SiF_4$ which was pumped out of the chamber.

Figure 2:
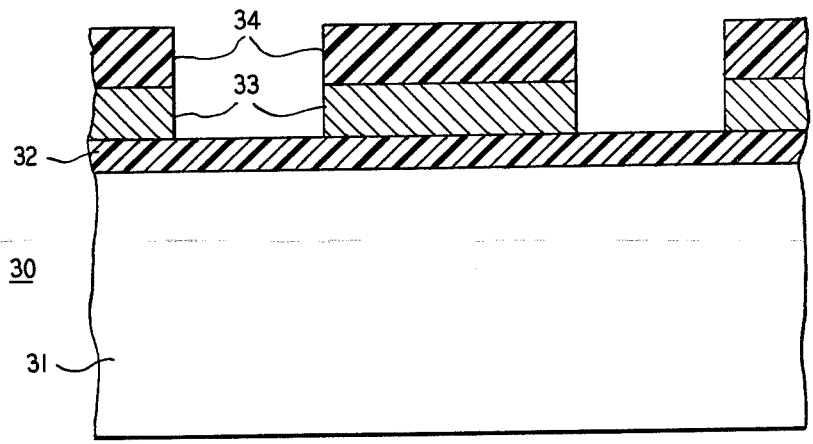
FIG. 2 is a cross-sectional view of a portion of an integrated circuit which has been etched in accordance with one embodiment of the invention.

FIG. 2 shows a portion of the resulting semiconductor structure when the etching reaction is completed at the proper time. The polycrystalline silicon layer 33 had been formed by a standard low pressure chemical vapor deposition utilizing gases of silane and nitrogen at a pressure of 0.36 Torr while heating the semiconductor body to a temperature of 620 degrees C. resulting in a deposition rate of 100 Angstroms/min. The areas of the polycrystalline silicon layer 33 which were not protected by the photoresist mask, 34, were completely etched through. Insulating layer, 32, which is typically $SiO_2$, formed on the semiconductor body, 31, has a much slower etch rate and so was substantially unaffected. The unetched portions of the polycrystalline layer will comprise the gate electrodes for FETs formed later. As long as the etching reaction is stopped at the point when the exposed portions of the layer are completely etched through, the gate will be well-defined as indicated. A certain amount of undercutting can be tolerated as long as the same degree of undercutting can be reproduced in each reaction.

In accordance with the invention, the reaction was terminated at the point where the silicon layer was just etched through or at a predetermined time thereafter by monitoring impedance changes caused by changes in the composition of the plasma during the reaction. This can be done conveniently by monitoring the impedance mismatch between the rf source and the plasma during the reaction.

As the start of the reaction, the impedance was properly tuned by impedance matching network 16 in combination with impedance detector 17 which are part of the standard plasma etching apparatus. This condition constitutes a resistive impedance. It has been discovered that at some point in the reaction, the impedance will rise sharply and reach a maximum value. Depending upon the type of gas used, the impedance will either remain at that value or will return to the original tuned condition. In the former case, the impedance characteristic is believed due to the buildup of the reactive gas species which are no longer being consumed as the reaction nears completion. The maximum value of the curve in such cases indicates the point at which the layer has been completely etched through. In the second case, it is believed that the impedance characteristic results from the reaction product of the particular gas being used, and so the impedance will initially increase and then return to the original tuned condition. In this case, therefore, at the point where the impedance returns to its initial (minimum) value, the layer has been completely etched through. Thus, by providing a measurement of the impedance of the plasma during the etching reaction and cutting of the power when the change in impedance reaches zero, either at a maximum or minimum, the proper amount of etching is achieved.

Figure 3:
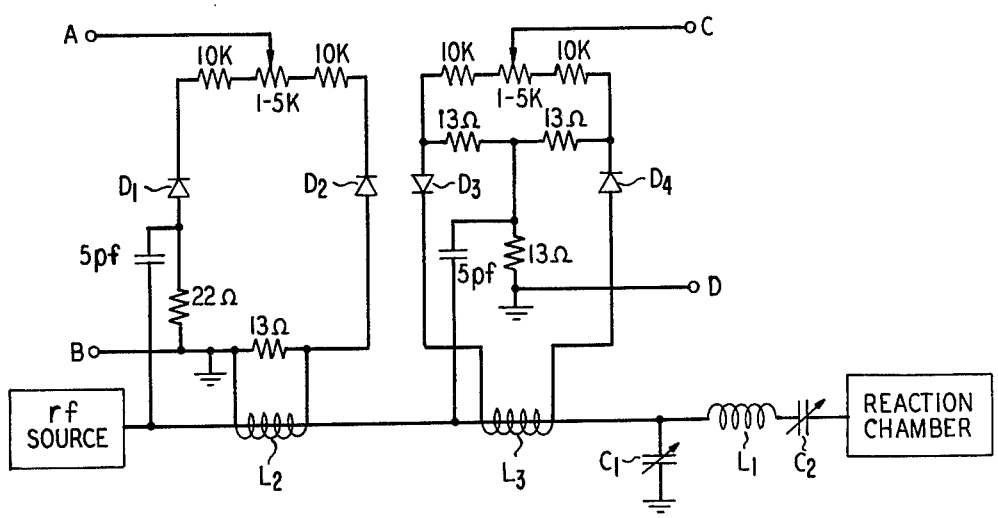
FIG. 3 is a circuit schematic diagram of an impedance detector and impedance matching network which may be utilized in accordance with one embodiment of the present invention.

FIG. 3 illustrates a typical impedance detector and matching circuit which may be utilized in the present invention. Since these circuits are fairly standard in plasma etching apparatus and are known to those skilled in the art, they will not be discussed in great detail. Ordinarily, such circuits are used to set the impedance so there is a match at least initially between the source and load (reaction chamber). This is done by manually adjusting capacitors $C_1$ and $C_2$ in the standard L-C circuit shown. The impedance mismatch is detected by inductors $L_2$ and $L_3$ which were separated by a distance of approximately 5 cm. A current is produced in inductors $L_2$ and $L_3$ which is proportional, respectively, to the voltage and phase of the standing wave produced on the transmission line when there is an impedance mismatch. Variations in impedance mismatch, in turn, are directly related to the impedance of the plasma. The current produced is rectified by diodes $D_1$–$D_4$ and a signal is picked up from the 1–5K resistors so that a signal indicative of the magnitude of the wave appears across terminals A and B and a signal indicative of the phase appears across terminals C and D.

Figure 4:
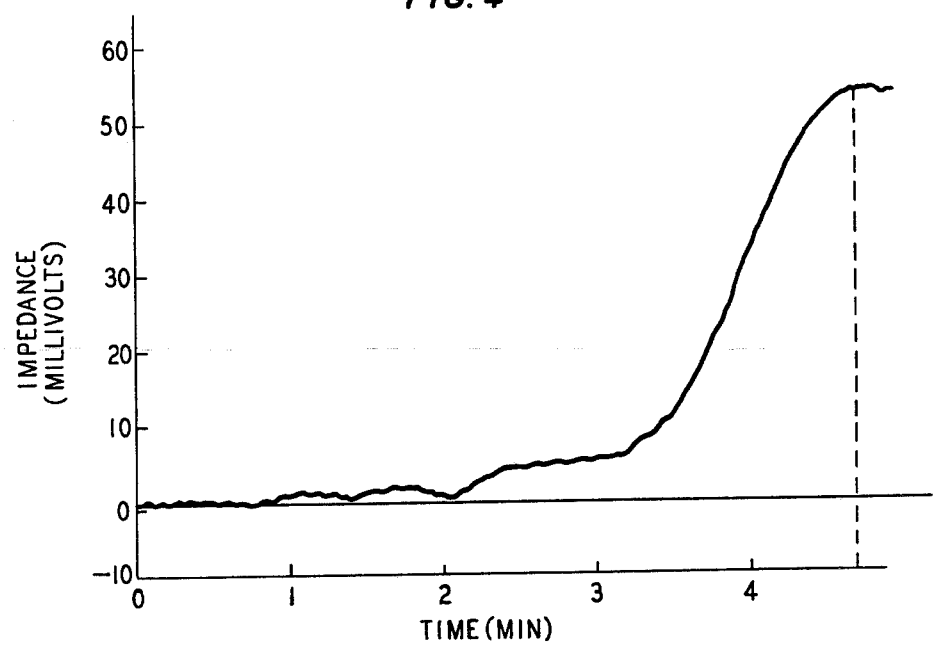
FIG. 4 is an approximate respresentation of impedance mismatch as a function of time for a typical etching reaction in accordance with one embodiment of the invention.

In this example, a visual repesentation of the impedance mismatch was provided by coupling a stripeline recorder (18 of FIG. 1) across terminals C and D of the detector. The recorder was a Model 7100B sold by Hewlett Packard. FIG. 4 is an approximate representation of the impedance curve of a typical reaction as recorded by the recorder when 9 semiconductor bodies were placed in the chamber. The power was turned on to generate the plasma and the capacitors of the matching network adjusted to produce a zero mismatch. This latter point was chosen as $t=0$ in the curve. It can easily be seen that the curve began to rise sharply as the reaction neared completion. When the curve reached a maximum (at approximately $t=4.5$ min) the polysilicon layer on each body had been completely etched through. Thus, all an operator need do is watch the curve being recorded and turn off the power when the curve reaches a maximum to completely etch with no undercutting. When etching polycrystalline silicon, large grain size silicon may be left behind in the exposed areas even after the layer is completely etched. It may be desirable, therefore, for cosmetic purpose, to continue etching after the peak is reached. It has been found that etching for an additional 30 seconds after the peak is reached will remove this material. Such additional etching will result in some undercutting. However, by using the present invention, the same degree of undercutting can be made reproducibly and the etching masks formulated with this in mind so that precise line widths can be obtained. It should be realized that the etch time may vary depending upon the number of wafers being processed. The shape of the impedance curve will not be significantly affected, however, where, as here, there is a large difference in etch rate between the layer being etched and the underlying layer.

Thus, in general, the operation can be instructed to cut the power at the peak or at a predetermined time after the peak. In any case, a precise determination of the completion of the reaction is indicated by the recorder without any judgment by the operator.

Figure 5:
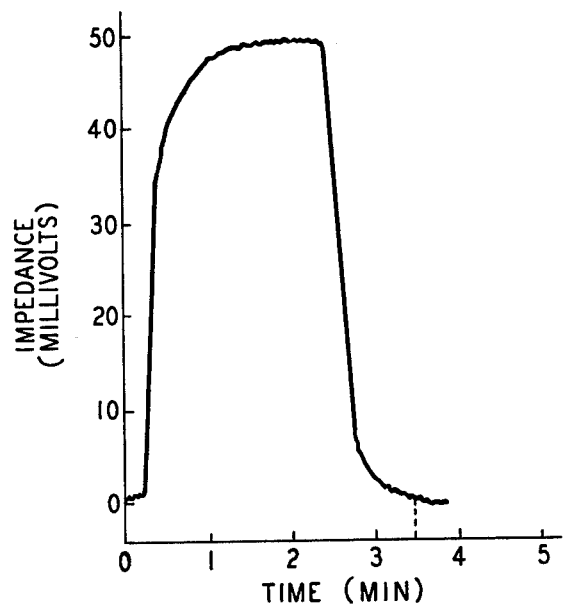
FIG. 5 is an approximate representation of impedance mismatch as a function of time for a typical etching reaction in accordance with a further embodiment of the invention.

Etching reactions were also done utilizing $CClF_3$ as the reactant gas and processing two wafers at a time. The gas was introduced at a flow rate of 50-100 SCCM and approximately 100 watts of power was applied to the electrodes. Due to the different chemical reaction involved, the impedance curves differed from those in the previous example. In this case, it is believed that the etching reaction is initiated by chlorine ions which react with the polycrystalline silicon to produce a silicon chloride. It is theorized that the silicon chloride then reacts with a $CF_3$ radical to produce $SiF_4$ and it is the presence of this reaction produce which primarily determines the impedance. An approximate representation of a typical curve in this example is shown in FIG. 5. Again, the impedance matching circuit was adjusted to produce a zero mismatch and this point was chosen as $t=0$. Here, the impedance rose almost immediately to a maximum value. This is apparently due to the fact that the impedance is affected by the reaction product rather than the reactant species. After some period of time (in this example, approximately $2\frac{1}{2}$ minutes), the impedance decreased rapidly until it reaches a minimum at a tuned condition. When the minimum was reached, the reaction was completed (here at $t \simeq 3\frac{1}{2}$ minutes). The power can be turned off at this point or continued for a predetermined time thereafter as in the previous example to remove large grain silicon left behind in the exposed semiconductor area. Again it was found that continuing the etching for 30 seconds after the indication of complete etching of the layer would remove this material. Thus, in reactions such as these where impedance is determined by the product of the reaction, the operation is instructed to ignore the initial peak and to turn off the power when the curve reaches a minimum value or at some predetermined time thereafter. Again, a precise determination of the completion of the reaction is indicated on the recorder without any judgment by the operator.

It should be appreciated that the present invention is not limited to any particular detection means for monitoring impedance. Thus, detection circuits other than that shown in FIG. 3 may be employed. It will also be realized that the reactance of the reflected wave in this apparatus and utilizing the particular matching network was inductive, and therefore the presence of impedance mismatch was measured as a positive voltage signal. If the reactance is capacitive, a negative voltage would be detected producing a mirror image of the curves in FIGS. 4 and 5. In such cases, a positive curve can be traced by reversing the polarity of the recorder contacts to the impedance detector.

Figure 6:
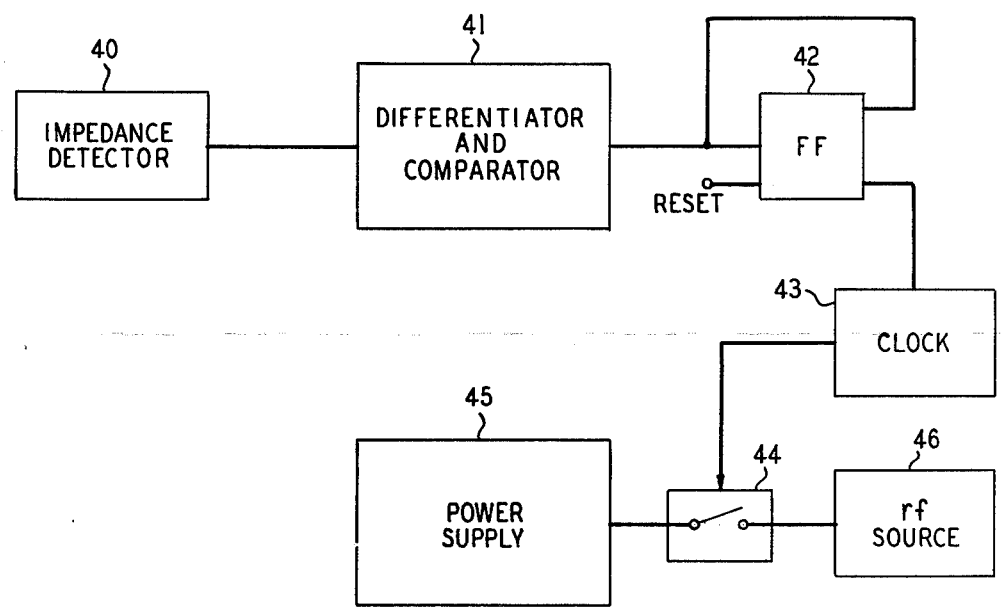
FIG. 6 is a schematic illustration of a system for automatic shut-off of the reaction which can be utilized in accordance with one embodiment of the invention.

It should also be realized that the recorder can be eliminated and a circuit provided for automatic shut-off of the power when the impedance reaches the appropriate value in accordance with the invention. A basic means for accomplishing such a shut-off is shown in the block diagram of FIG. 6. A differentiator and comparator circuit 41 is coupled to the impedance detector 40. The differentiator circuit samples the change in the signal from the detector at specified intervals. The comparator determines if the change in voltage is above or below a specified noise level. For example, a suitable noise level for the output of the detector illustrated in FIG. 4 might be 2 millivolts/sec. When the change in voltage exceeds the noise level, a signal is produced which activates the flip-flop circuit, 42, to the on state. The flip-flop will remain on as long as the change in voltage as measured by the differentiator exceeds the noise level, i.e., during the portion of the curve in FIG. 4 which is rising. When the maximum is reached, the change in voltage will again fall below the noise level and the signal from the differentiator and comparator will shut off causing the flip-flop to return to the off state. This triggers clock, 43, which in this example will produce a signal for 30 seconds. When the signal from the clock terminates, switch 44 is opened cutting off the power from power supply 45 to the rf source 46. In the case of a detector signal such as that shown in FIG. 5, the differentiator and comparator can be chosen so that a signal is produced only when a negative change in voltage is sampled (during the portion of the detector signal which is falling). The flip-flop and clock are activated as before to shut off the power. At the start of each run, the flip-flop can be reset.

The precise circuitry required to perform these functions is easily ascertained by those skilled in the art and is therefore not discussed. It will be noted, for example, that a microprocessor can be programmed to perform all these functions.

As alluded to above, although the invention contemplates completion of the etching reaction when the change in impedance reaches zero, either at an absolute maximum or minimum, as a practical matter some increment should be provided to account for noise in the detector signal. The increment provided for is chosen on the basis of the magnitude of the impedance signal. In general, it will be preferable to choose an increment which is no greater than one tenth of the maximum signal. For most commercial applications, it would be most advantageous to choose an increment of less than one twenty fifth of the maximum signal. In any event, it will be realized that the invention is defined in the appended claims in terms of stopping the reaction at, or a predetermined time after, the impedance change essentially reaches zero. This should be understood to include a reasonable range above and below a zero value to account for possible noise in the detected signal.

Although the invention has been described in terms of etching polycrystalline silicon layers, it is equally applicable to other materials which can be etched by plasma etching techniques. For example, silicon nitride layers were formed over semiconductor bodies to thicknesses of 1.35 $\mu$m by standard low pressure chemical vapor depositions utilizing dichlorosilane and ammonia gases at a pressure of 0.5 Torr with the semiconductor heated to 770 degrees C. to give a deposition rate of 30

Angstroms/min. The layers were selectively etched using a photoresist mask by placing the bodies in the apparatus of FIG. 1. The chamber was evacuated to a pressure of 0.02 Torr and the same mixture of primarily $CF_4+O_2$ previously described was introduced into the chamber at a flow rate of 50–100 SCCM. The power applied to the electrodes was approximately 100 watts to generate the plasma. The impedance was monitored as before and essentially the same curve as shown in FIG. 4 was traced by the recorder. Again, when the impedance reached a maximum value, the layer has been completely etched through. This example demonstrated that the principles of the invention are not peculiar to etching of polycrystalline silicon.

Figure 7:
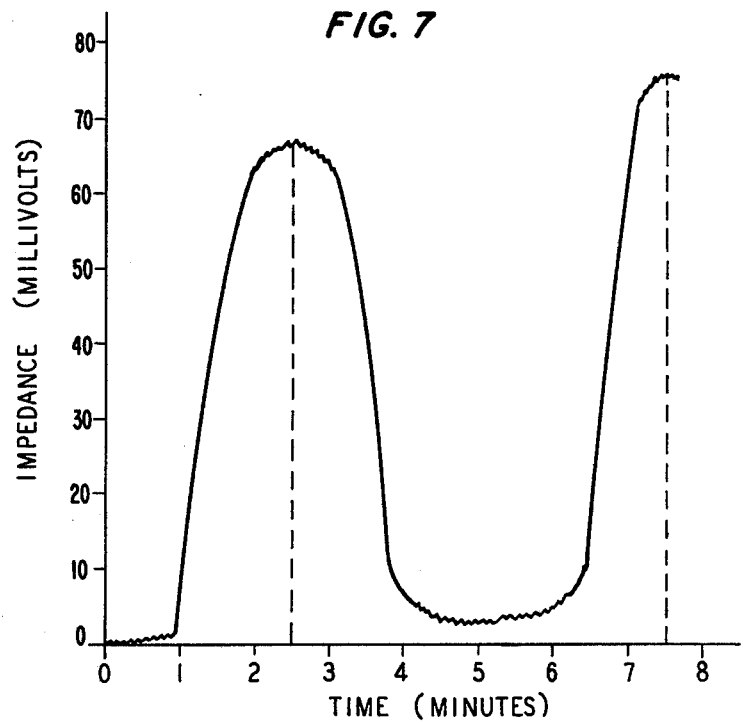
FIG. 7 is an approximate representation of impedance mismatch as a function of time for a typical etching reaction in accordance with a further embodiment of the invention.

The invention is also useful for etching multiple layers formed over a body. For example, layers of polycrystalline silicon approximately 3500 Angstroms thick were formed over silicon dioxide layers on semiconductor bodies by a standard chemical vapor deposition. Layers of silicon nitride were then formed over the polycrystalline silicon layers to a thickness of approximately 800 Angstroms also by a standard chemical vapor deposition. A photoresist mask was formed over the nitride layers. Four such structures were placed in the apparatus of FIG. 1 and the chamber pumped down to a pressure of approximately 0.02 T. Again, a mixture of primarily $CF_4$ and $O_2$ was introduced into the chamber of a flow rate of approximately 50–100 SCCM and a power of approximately 100 watts supplied to the electrode means. An approximate representation of the impedance curve as traced by the recorder during the etching reaction is shown in FIG. 7. Again, the impedance was tuned and the point of zero mismatch chosen at $t=0$. As illustrated, the impedance curve reached a maximum at approximately $t=2\frac{1}{2}$ minutes and this point was found to be the point at which the silicon nitride layers were essentially completely etched through. The reaction was continued so that the impedance curve returned essentially to its original value. Then, the curve rose again, reaching a maximum at approximately $t=7\frac{1}{2}$ minutes as shown. This was found to be the point at which the polycrystalline silicon layers were essentially completely etched through. Thus, the invention can be used to precisely determine the end point of the reaction when etching several layers on a body without any judgement required by an operator.

Although specific gases have been described in these examples, it should be understood that the invention in generally applicable regardless of the type of gas used. Preferably, the gas will include fluorine or chlorine ions. Typical examples are $BCl_3$, $CCl_4$, $C_2F_6$ and $O_2$, and $C_3F_8$ and $O_2$.

Although the means for monitoring the impedance change in the plasma is measuring the impedance mismatch between the rf source and the plasma in the specific examples described, it should be appreciated that measuring other electrical parameters may also provide a useful monitor for this impedance change. For example, measuring the rf or dc potential of the electrode means during the etching region may be employed.

Various additional modifications will become apparent to those skilled in the art. All such variations which basically rely on the teachings through which the invention has advanced the art are properly considered within the spirit and scope of the invention.

I claim:

1. A method of etching a selected area of a layer (33 of FIG. 2) formed over a body (31) comprising the steps of placing the body in a chamber (10 of FIG. 1) between electrode means (14 and 19), introducing a reactant gas into said chamber, and supplying power to said electrodes so as to create a plasma in said chamber capable of etching said layer, characterized in that the impedance change of the plasma is monitored during the etching reaction and the power to the elecrodes means is turned off at a predetermined time with respect to the point where the impedance change essentially reaches zero.

2. The method according to claim 1 wherein the power is turned off at the point where the impedance change essentially reaches zero.

3. The method according to claim 1 wherein the power is turned off at a predetermined time after the impedance change essentially reaches zero.

4. The method according to claim 1 wherein the power is turned off at a predetermined time with respect to the point where the impedance essentially reaches an absolute maximum value.

5. The method according to claim 1 wherein the power is turned off at a predetermined time with respect to the point where the impedance essentially reaches an absolute minimum value after having risen to an absolute maximum value.

6. The method according to claim 4 wherein the reactant gas comprises a mixture of $CF_4$ and $O_2$.

7. The method according to claim 5 wherein the reactant gas comprises $CClF_3$.

8. The method according to claim 1 wherein the layer comprises polycrystalline silicon.

9. The method according to claim 3 wherein the power is turned off approximately 30 seconds after the impedance change essentially reaches zero.

10. The method according to claim 1 wherein the impedance change is monitored by tracing a curve of the impedance by means of a stripline recorder (18 of FIG. 1).

11. The method according to claim 1 wherein the impedance change is monitored by a differentiator and comparator circuit (41 of FIG. 6).

12. The method according to claim 1 wherein the impedance change is monitored by detecting the impedance mismatch between the power supply and the plasma during the etching reaction.

13. A method of etching a selected area of a polycrystalline silicon layer (33 of FIG. 2) formed over a semiconductor body (31) comprising the steps of placing the body in a chamber (10 of FIG. 1) between electrode means (14 and 19), introducing a reactant gas comprising $CF_4$ and $O_2$ into said chamber, and supplying power to said electrode means so as to create a plasma in said chamber capable of etching said layer, characterized in that the impedance change of the plasma is monitored during the etching reaction and the power to the electrode means is turned off at a predetermined time with respect to the point where the impedance change essentially reaches zero at an absolute maximum.

14. A method of etching a selected area of a polycrystalline silicon layer (33 of FIG. 2) formed over a semiconductor body (31) comprising the steps of placing the body in a chamber (10 of FIG. 1) between electrode means (14 and 19), introducing a reactant gas comprising $CClF_3$ into said chamber, and supplying power to said electrode means so as to create a plasma in said chamber capable of etching said layer, characterized in that the impedance change of the plasma is monitored during the etching reaction and the power to the electrode means is turned off at a predetermined time with respect to the point where the impedance change essentially reaches zero at an absolute minimum after the impedance has initially risen to an absolute maximum value.

* * * * *

UNITED STATES PATENT AND TRADEMARK OFFICE
CERTIFICATE OF CORRECTION

PATENT NO. : 4,207,137
DATED : June 10, 1980
INVENTOR(S) : Angelo R. Tretola

It is certified that error appears in the above-identified patent and that said Letters Patent are hereby corrected as shown below:

In the Title, line 3, "RF POWER" should read --PLASMA--. Column 4, line 24, "of" should read --off--. Column 5, line 16, "operation" should read --operator--; line 32, "produce" should read --product--; line 42, "reaches" should read --reached--; line 53, "tion" should read --tor--. Column 7, line 27, "of", first occurrence, should read --at--.

Signed and Sealed this

Eleventh Day of November 1980

[SEAL]

Attest:

SIDNEY A. DIAMOND

Attesting Officer

Commissioner of Patents and Trademarks